United States Patent [19]

Chow et al.

[11] Patent Number: 4,901,127
[45] Date of Patent: Feb. 13, 1990

[54] CIRCUIT INCLUDING A COMBINED INSULATED GATE BIPOLAR TRANSISTOR/MOSFET

[75] Inventors: Tat-Sing P. Chow, Schenectady, N.Y.; Bantval J. Baliga, Raleigh, N.C.

[73] Assignee: General Electric Company, Schenectady, N.Y.

[21] Appl. No.: 254,897

[22] Filed: Oct. 7, 1988

[51] Int. Cl.$^4$ .......................................... H01C 27/02
[52] U.S. Cl. ................................. 357/23.4; 307/446; 307/570; 357/43; 357/23.8; 357/38
[58] Field of Search .................. 307/446, 570; 357/43, 357/23.4, 23.8, 38

[56] References Cited

U.S. PATENT DOCUMENTS 4,344,081 8/1982 Pao ........................................ 357/43
4,680,604 7/1987 Nakagawa .......................... 357/23.4

OTHER PUBLICATIONS

Chow, T., "A New Hybrid VDMOS-LIGBT Transistor", *IEEE Electron Device Letters*, vol. 9, No. 9, Sep. 1988, pp. 473–475.
Liu, D. et al., "A Novel Trench-Injector Power Device with Low ON Resistance and High Switching Speed", *IEEE Electron Device Letters*, vol. 9, No. 7, Jul. 1988, pp. 321–323.
Fossum, J. G. et al., "An Insightful Analysis of the Hybrid Insulated-Gate Bipolar Transistor", *IEEE Transactions on Electron Devices*, vol. 35, No. 9, Sep. 1988, pp. 1560–1562.

Primary Examiner—Andrew J. James
Assistant Examiner—David Soltz
Attorney, Agent, or Firm—Robert Ochis; James C. Davis, Jr.; Marvin Snyder

[57] ABSTRACT

An IGBT and FET are integrated in a common semiconductor body and share common source/emitter, base and drift regions and an insulated gate electrode. The ON-resistance and turn-off time of this device can be controlled by connecting the drain and collector electrodes to one main terminal for the device with a resistor between either the drain region/drift region interface or the collector junction and the main terminal of the device.

31 Claims, 8 Drawing Sheets

CIRCUIT INCLUDING A COMBINED INSULATED GATE BIPOLAR TRANSISTOR/MOSFET

BACKGROUND OF THE INVENTION

The present invention relates to the field of semiconductor devices, and more particularly, to the field of power semiconductor devices.

PRIOR ART

MOSFETs are desirable switching devices because of their fat switching time, particularly turn-off time. Unfortunately, the larger the voltage that such a device is designed to hold off, the larger the device ON-resistance becomes because of increasing drift region current-path length and resistance. Consequently, high voltage MOSFETs are too resistive to be considered ideal high voltage switching devices.

In high voltage insulated gate bipolar transistors (IGBTs) the ON-resistance is much less than that of a MOSFET designed to hold off the same high voltage because of the conductivity modulation of the drift region which IGBTs provide. Thus, IGBTs substantially overcome the problem of high ON-resistance in high voltage MOS gate controlled switching devices. Unfortunately, insulated gate bipolar transistors have a relatively long turn-off time because of the charge storage which results from their bipolar character.

There is a need for a high voltage switching device with the fast switching speed of the MOSFET and the low ON-resistance of the IGBT.

OBJECTS OF THE INVENTION

A primary object of the present invention is to provide a device or circuit including a combined MOSFET/IGBT which exhibits the benefits of both.

A further object is to provide a device or circuit including a combined IGBT/MOSFET in which the trade-off between ON-resistance and switching time is determined by component values.

Another object is to provide an integrated circuit in which the trade-off between switching speed and ON-resistance is set during the fabrication process.

SUMMARY OF THE INVENTION

The foregoing and other objects are accomplished in accordance with the invention by combining an IGBT and an MOSFET in the same semiconductor body in a manner in which they share common source/emitter, base and drift regions and a common first main electrode and a common insulated gate electrode. A drain/collector circuit is connected across the drain and collector of the integrated device and includes a second main terminal for the circuit. The second main terminal is connected to at least one of the collector junction and the drain/drift region interface by a resistive impedance and it may be connected to the other of them directly or by a resistive impedance. To maximize switching speed, the impedance between the second main terminal and the drain junction is minimized, while a non-minimum resistance is provided between the collector and the second main terminal. To minimize ON-resistance, the resistance connecting the second main terminal to the collector junction is minimized while a non-minimum resistance is provided between the drain and the second main terminal.

This device and circuit enable the user to control the trade-off between ON-resistance and switching speed in accordance with the needs of the particular circuit without requiring a separate device design for each different trade-off between ON-resistance and the turn-off time.

For versatility, it is preferred that the resistive impedance in the drain/collector circuit be external to the integrated device. However, where it is desired to minimize package size and/or packaging and circuit costs and a known trade-off between ON-resistance and switching speed is desired, the resistive impedance of the drain/collector circuit may be built into the integrated device as it is fabricated by controlling the doping levels of the drain region and collector region to provide desired resistive impedances within those regions.

DETAILED DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
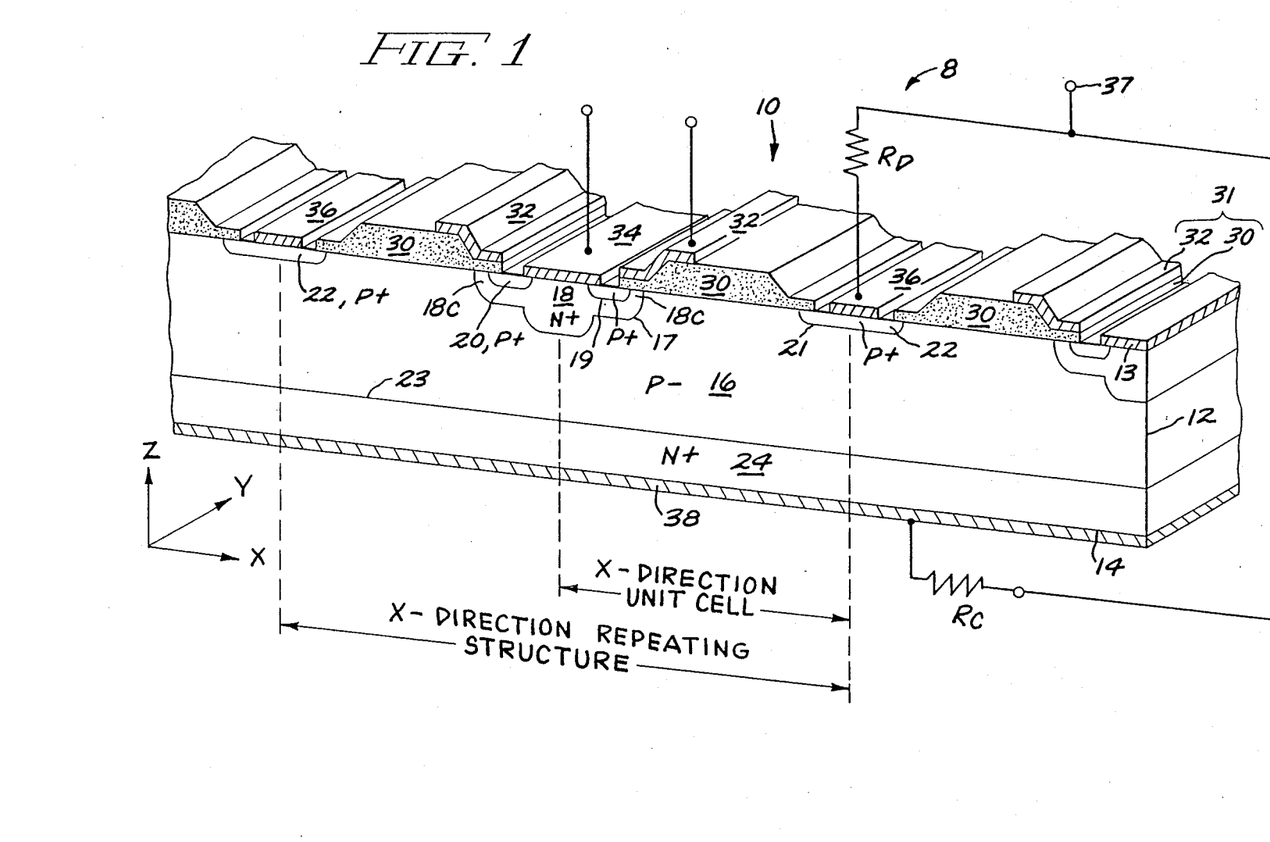
FIG. 1 is a perspective cross-section view of a first embodiment of a circuit in accordance with the present invention.

In FIG. 1, a circuit 8 includes a semiconductor device 10 comprising a body of semiconductor material 12 having upper and lower major surfaces 13 and 14, respectively. The semiconductor device is a multicellular device and FIG. 1 shows several X-direction cells. The semiconductor body includes a lightly doped P type (P−) drift region 16 disposed between the upper and lower surfaces. Region 16 extends to the upper surface 13. A base region 18 extends into the drift region 16 from the upper surface 13 and forms a PN junction 17 with the drift region. In the MOSFET art, the base region 18 is sometimes referred to as the body region of the FET, however, in this specification, the region 18 will be referred to as a base region to avoid confusion with the reference to the chip or wafer as a body of semiconductor material. A source/emitter region 20 is disposed in the base region 18, forms a PN junction 19 therewith and extends to the upper surface 13. A channel portion 18C of the base region is disposed adjacent the upper surface 13 between the source/emitter region 20 and the drift region 16. A drain region 22 is spaced from the base region 18 and extends into the drift region 16 from the upper surface 13 of the semiconductor body and forms an interface 21 therewith. The drain region is P type material, but more heavily doped than the drift region 16. The base, source/emitter and drain regions are each elongated in the Y-direction with the base and drain regions spaced apart in the X-direction. The individual cells are arranged as parallel, straight, Y-direction extending stripes. A collector region 24 of N type material extends from the second surface 14 toward the first surface 13, forms a PN junction 23 with the drift region and everywhere spaces the drift region 16 from the lower surface 14. Other collector region configurations may be employed, if desired.

An insulated gate electrode 31 is disposed on the upper surface 13 over the channel portion 18C of the base region. The insulated gate electrode 31 is comprised of an insulating layer 30 and a conductor layer 32 and is provided to control the conductivity of the channel region 18C of the base region for holes, i.e. the majority carriers in the source/emitter and drift regions. The insulating layer 30 continues along the upper surface toward the drain region to serve as a field oxide and passivation layer protecting that portion of the semiconductor surface. As can be seen, the FIG. 1 structure combines a lateral MOSFET and a vertical IGBT in the same structure with shared common source/emitter, base and drift regions and a common insulated gate electrode.

An first main electrode 34 is disposed on the upper surface 13 in ohmic contact with both the base region 18 and the source/emitter region 20. The electrode 34 serves as a first main terminal for the circuit. A drain electrode 36 is disposed on the upper surface 13 in ohmic contact with the drain region 22 and a collector electrode 38 is disposed on the lower surface 14 in ohmic contact with the collector region 24. A drain/collector circuit is connected between the drain electrode 36 and the collector electrode 38 and includes resistors $R_D$ and $R_C$ and a terminal 37 which serves as the second main terminal of the device. Either of the resistors $R_D$ or $R_C$ may have a zero resistance in accordance with the particular operating characteristics desired for the circuit and either or both of $R_D$ and $R_C$ may be integrated within the semiconductor body. Thus, the drain/collector circuit may be more accurately described as being connected between the collector junction and the drift region/drain region interface 21.

Figure 5:
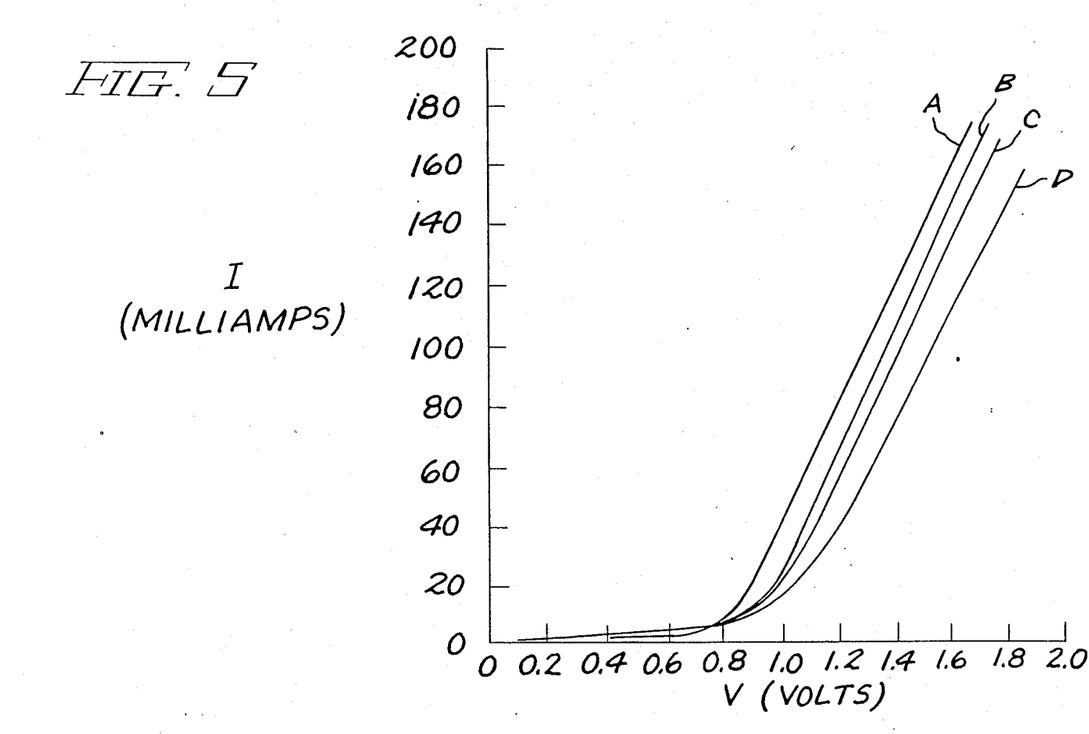
FIGS. 5–8 illustrate measured operating characteristics of devices and circuits in accordance with the invention.
Figure 6:
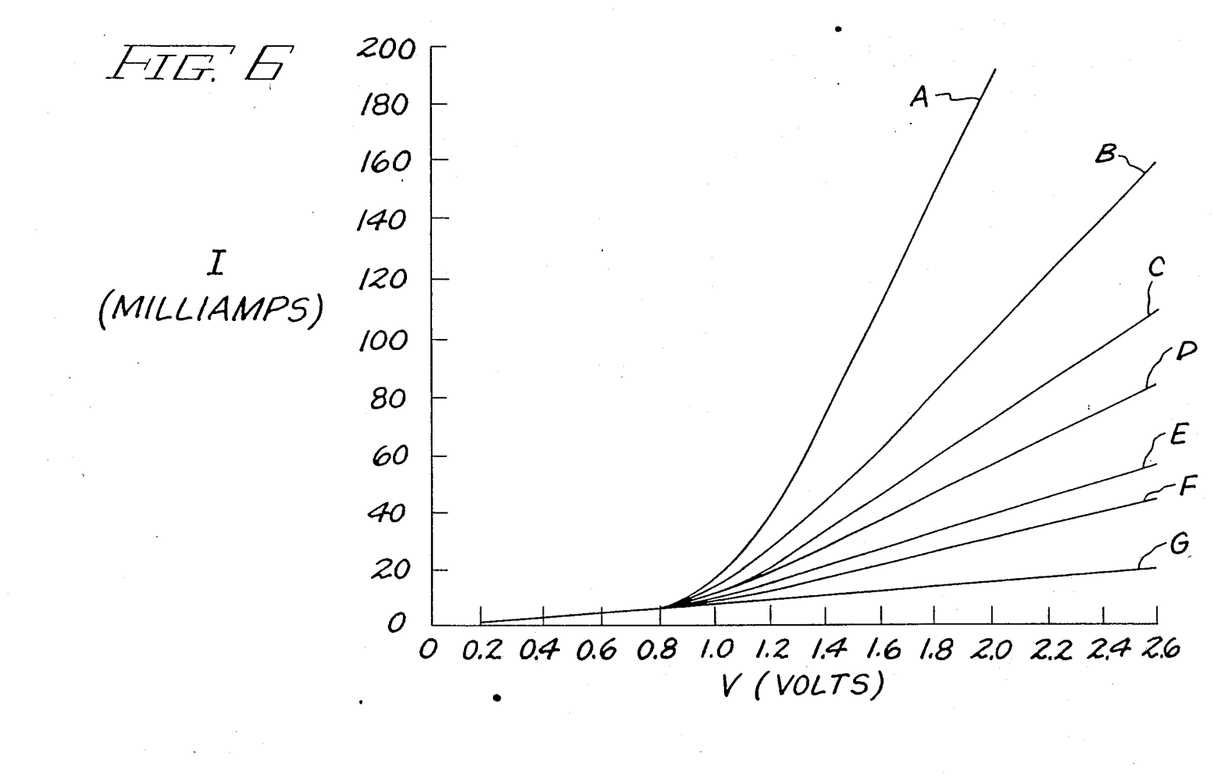

The operating characteristics of experimental devices of this type are illustrated in FIGS. 5 and 6. These devices were fabricated with a vertical drift region thickness of 50 microns, a lateral drift region length of 35 microns and a drift region doping concentration of $2 \times 10^{14}$ cm$^{-3}$ which are typical values for a 500 volt P channel device. The actual breakdown voltage of these devices could not be meaningfully determined because the test devices lacked edge terminations and therefore had actual breakdown voltages in the neighborhood of 20 volts.

The operating characteristics are shown in FIG. 5 for the situation in which $R_C$ is equal to zero and in which $R_D$ was A ∞ (drain open), B 100Ω, C 50Ω, and D 0106. The current and voltage are measured across the terminals 34 and 37 and the gate electrode was held at −15 volts relative to electrode 34. As can be seen from these curves, as the drain resistance is reduced, the conductivity modulation within the drift region is reduced. This results in an increase in ON-resistance.

FIG. 6 illustrates the operating characteristics of these devices for the situation in which the resistance $R_D$ is zero and the resistance $R_C$ is A 0Ω, B 5Ω, C 10Ω, D 15Ω, E 30Ω, F 50Ω, and G ∞ (collector open). As can be seen from these curves, as the collector resistance is reduced, the ON-resistance decreases. This is a result of increasing modulation.

Corresponding turn-off times for these various resistance combinations are:

| $R_D$ | $R_C$ | Turn-off Time (μs) |
|---|---|---|
| 0 | 0 | <0.22 |
| ∞ | 0 | 4.3 |
| 100Ω | 0 | 1.65 |
| 30Ω | 0 | 0.36 |

Figure 2:
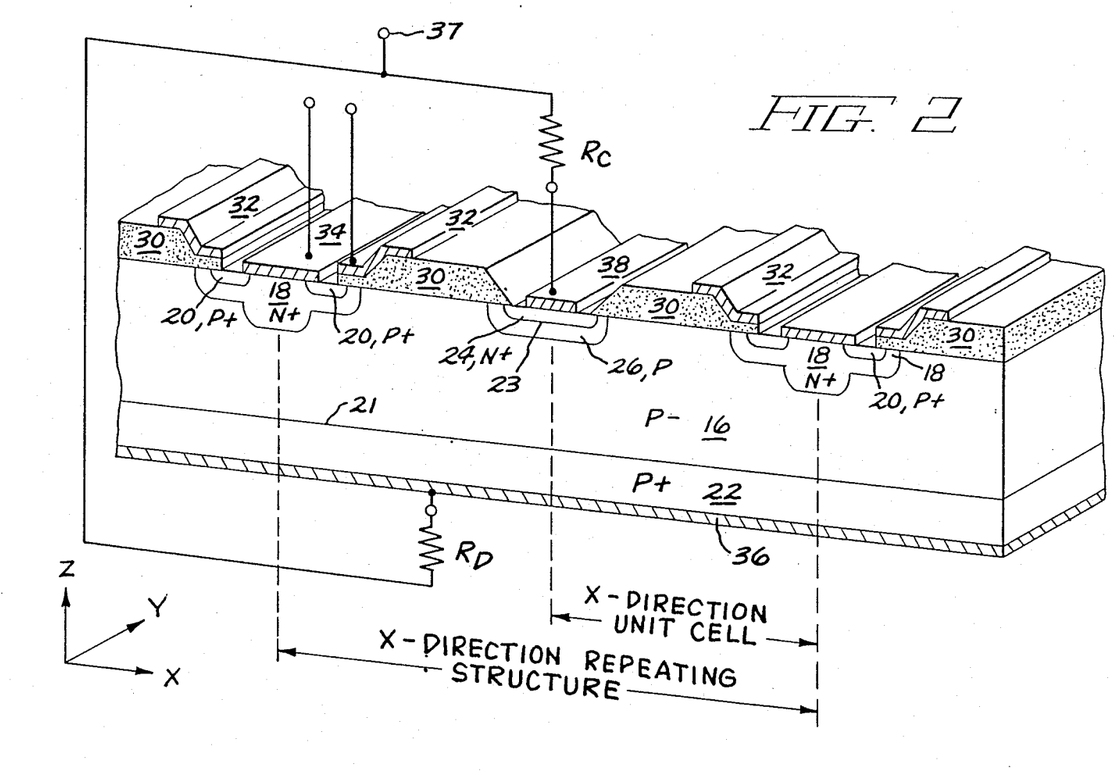
FIGS. 2–4 illustrate perspective cross-section views of alternative embodiments of a circuit in accordance with the present invention.
Figure 7:
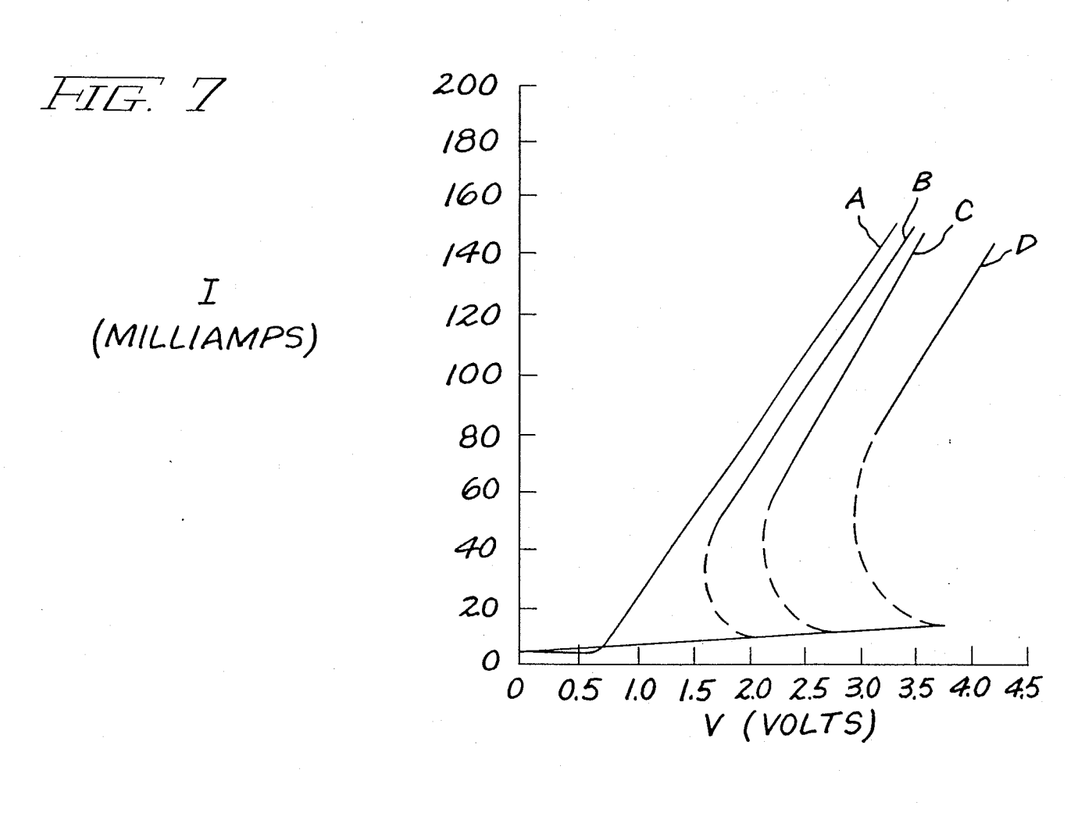

An alternative embodiment of a circuit in accordance with the present invention is illustrated in FIG. 2 where the IGBT is a lateral device and the MOSFET is a vertical device. Corresponding reference numerals are used in FIGS. 1 and 2 because of the similarity of device structure and operation. This structure includes a P type buffer portion 26 of the drift region 16 adjacent to the collector region 24. This buffer portion is introduced in order to prevent punch-through from the P− drift region to N+ collector region when the device is under high voltages without requiring excessive lateral spacing between the base and collector regions. A similar buffer region or layer may be included in the FIG. 1 device if a thinner drift region is desired. The operating characteristics of this device are shown in FIG. 7 for the conditions under which $R_C=0$ and $R_D$ is A ∞ B 100Ω, C 50Ω, and D 0Ω and are similar to those of the FIG. 1 device, as shown in FIG. 5, except for a snap back (at the onset of conductivity modulation) at the knee of the curves B, C and D for $R_D=$100Ω, 50Ω, and 0Ω. The current and voltage measurement points and the gate voltage are the same as for FIGS. 5 and 6.

Figure 8:
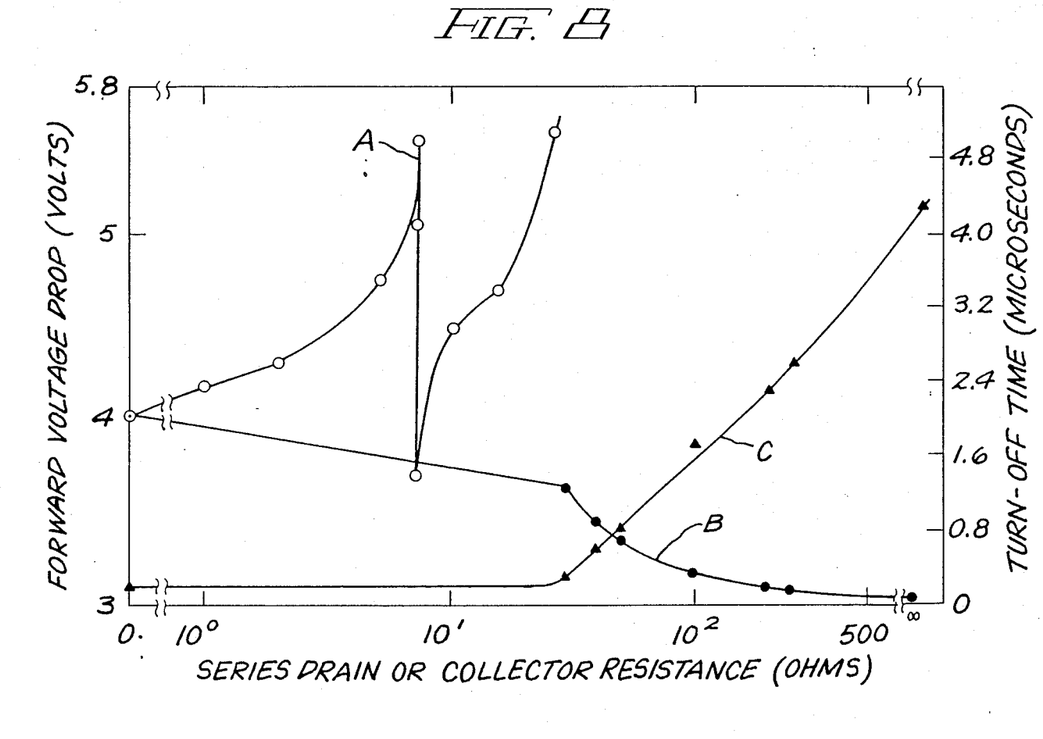

The turn-off times for this device with $R_D=0$ and $R_C$ equals various values were all below 200 nanoseconds and could not be accurately measured with our test set up. The forward voltage drops for various resistor values are illustrated in FIG. 8 by curve A. As can be seen, the forward drop was in all cases between 4 and 6 volts, which is much lower than is normally provided by a 500 volt P− VDMOSFET. Where $R_C=0$, the device provided forward drops in the range of 3-4 volts and turn-off times between 4.3 and 0.2 microseconds as shown by curves B and C, respectively.

These operating characteristics clearly demonstrate the ability of this circuit to provide external control over the trade-off between ON-resistance and turn-off time.

Figure 3:
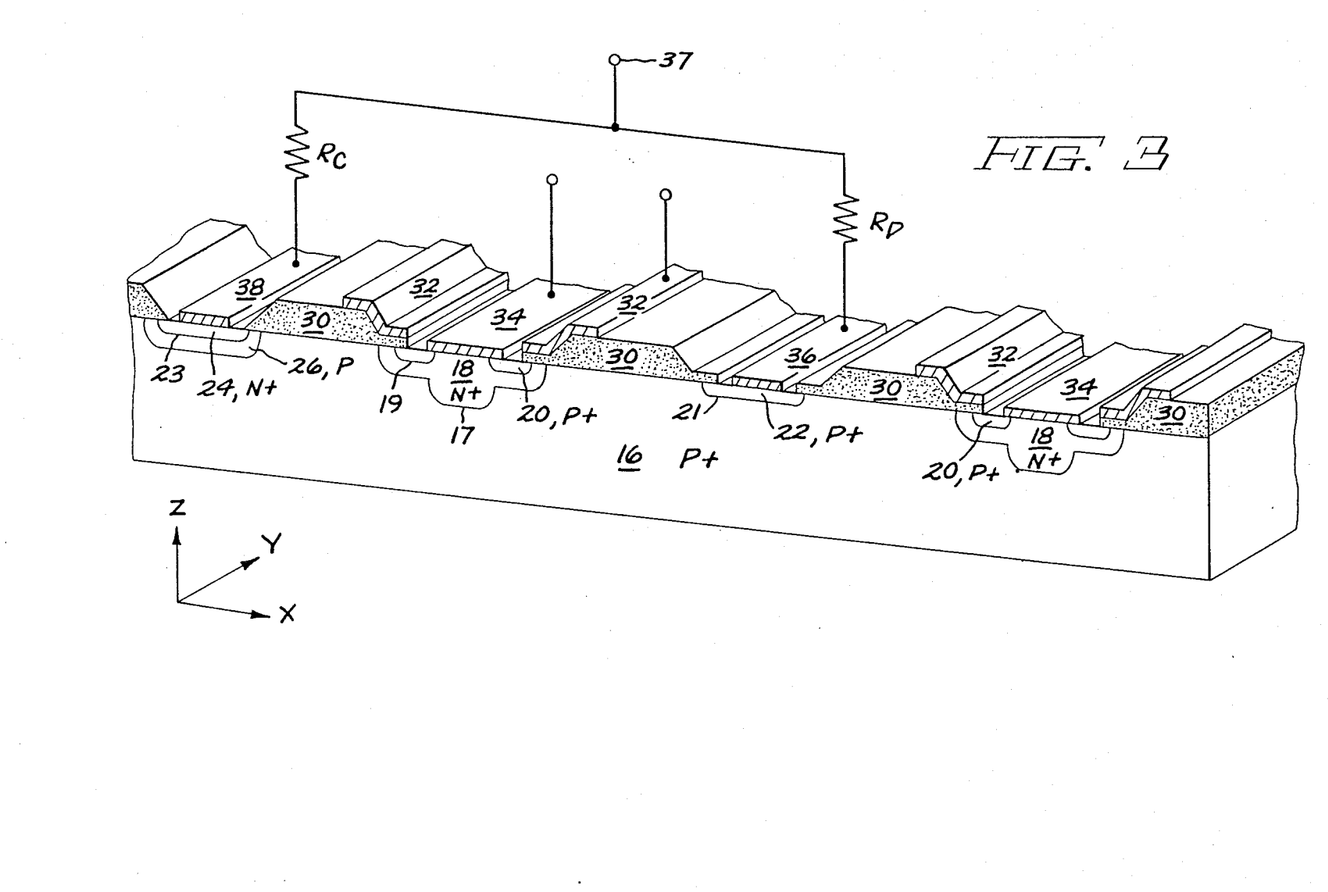

A further alternative embodiment is illustrated in FIG. 3 in which all the electrodes are on the upper surface of the device, whereby both the MOSFET and the IGBT are lateral devices. However, the FIG. 3 structure is not preferred because of the relatively long path length during turn-off for extracting, through the drain region, carriers stored beneath the collector region.

Figure 4:
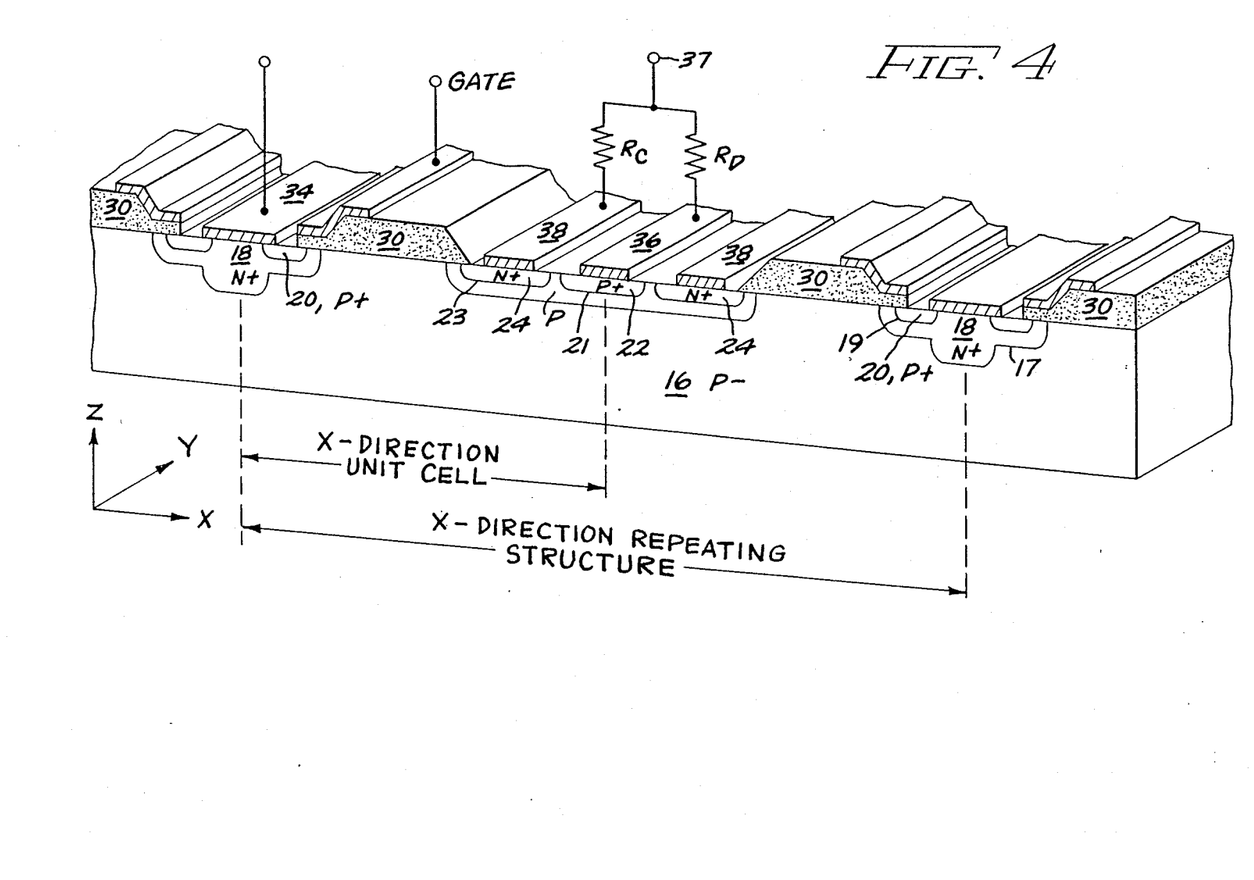

An alternative configuration for an all-lateral device version of this circuit is shown in FIG. 4. The major difference between the FIG. 3 and FIG. 4 structures is the close proximity of the collector and drain regions in FIG. 4. This close proximity has several effects. First, turn-off time is decreased relative to the FIG. 3 device because the maximum travel distance to a drain region is cut in half. Second, ON-resistance may increase because of the drain region reducing the effectiveness of charge injection by the collector region. Third, metallization patterning is more complex. The reduction in collector injection is minimized by positioning the drain region between two collector regions or in an aperture in a single collector region in which the two segments shown are connected at the Y-direction ends of the collector stripes or at other locations not shown in FIG. 4. The metallization patterning complexity can be reduced by providing a single common metallization for the collector and drain regions and providing fixed values for $R_D$ and $R_C$ by adjusting collector and drain doping concentrations.

Rather than placing the drain region in an aperture in the collector region, one of the collector region segments may be omitted, thereby narrowing the unit cell and providing a drain/collector structure which has different structures as seen from the two adjacent base regions.

In any of these devices (FIGS. 1-4), specific $R_D$ and $R_C$ values can be built into the device structure during the fabrication process. The resistor $R_D$ may be built into the drain region by reducing its doping concentration to increase the resistivity of the drain region and thereby incorporate the drain resistance into the drain region. In a similar manner, the collector resistance can be built into the collector region by reducing its doping level to increase its resistivity. It is noted, that because of the effect of collector region doping concentration on collector injection efficiency, reducing the collector doping in order to increase its resistance also has an effect on the injection efficiency of the collector region and thus conductivity modulation of the drift region. As a further alternative, the resistances may be built into the drain and collector electrodes either within the metallization itself or as contact resistance at the metal/semiconductor interface.

The drain/collector circuit can be integrated within the semiconductor body if desired.

For greatest versatility, it is preferred to fabricate this device with the internal $R_D$ and $R_C$ as small as device fabrication processes allow in order that the trade-off between ON-resistance and turn-off time may be controlled by externally provided resistors. However, as a clearly acceptable alternative, especially where a particular trade-off is desired for a large quantity of devices, these resistances may be built into the device structure itself in order to reduce packaging costs, package size and external circuit complexity.

The cells of this multicellular device have been shown and described as being parallel, elongated in the Y-direction (straight stripe) cells. The invention is equally applicable to rectangular, including square; hexagonal; and round, including circular; cell configurations, whether arranged in an array of uniform cells or as concentric cells of increasing circumference.

It will be recognized that the conductivity type of all the semiconductor regions can be reversed to provide complementary devices. While the invention has been described in terms of the use of silicon semiconductor material, it will be understood that other semiconductor materials may be used as is desired.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A circuit comprising: a semiconductor device comprised of an insulated gate bipolar transistor and an MOSFET combined and integrated in a single body of semiconductor material, said body including:
   a drift region of one type conductivity,
   a base region of opposite type conductivity forming a first PN junction with said drift region,
   a source/emitter region of said one type conductivity disposed within and forming a second PN junction with said base region,
   said base region including a channel portion disposed between aid source and drift regions,
   a collector region of said opposite type conductivity forming a third PN junction with said drift region and spaced from said base region, and
   a drain region spaced from said base region, having said one type conductivity forming an interface with said drift region and being more heavily doped than said drift region;
said semiconductor device further including:
   an insulated gate electrode disposed adjacent said channel portion of said base region for controlling the conductivity of said channel portion of said base region for charge carriers of said one type conductivity,
   a first electrode disposed in ohmic contact with said base and source/emitter regions and comprising a first main terminal of said circuit
   a drain electrode disposed in ohmic contact with said drain region, and
   a collector electrode disposed in ohmic contact with said collector region; and
   a drain/collector circuit connected to said device, said drain/collector circuit including said drain and collector regions, said drain and collector electrodes, a non-zero resistive impedance and a second main terminal.

2. The circuit recited in claim 1 wherein:
said resistive impedance is incorporated within said body of semiconductor material.

3. The circuit recited in claim 1 wherein:
said second main terminal is connected through at least a portion of said resistive impedance to said interface between said drain and drift regions.

4. The circuit recited in claim 3 wherein:
said second main electrode comprises said collector electrode.

5. The circuit recited in claim 3 wherein:
said resistive impedance is external to said device; and
said second main terminal is connected through a portion of said resistive impedance to said collector electrode.

6. The circuit recited in claim 2 wherein:
said second main terminal is connected through at least a portion of said resistive impedance to said third PN junction.

7. The circuit recited in claim 6 wherein:
said second main terminal comprises said drain electrode.

8. The circuit recited in claim 1 wherein:
said semiconductor device comprises a vertical insulated gate bipolar transistor and a lateral MOSFET and said body of semiconductor material has:
first and second opposed major surfaces,
said drift region extending to said first major surface,
said base region extending into said drift region from said first major surface,
said source/emitter region extending into said base region from said first major surface, said drain region extending into said drift region from said first major surface, said collector region extending from said second major surface toward said first major surface, said channel portion of said base region disposed adjacent said first major surface; and said insulated gate electrode is disposed on said first major surface.

9. The circuit recited in claim 8 wherein:

said collector region spaces said drift region from said second major surface.

10. The circuit recited in claim 1 wherein said circuit comprises:

a lateral insulated gate bipolar transistor and a vertical MOSFET and said body of semiconductor material has:

first and second major surfaces with said drift region disposed therebetween, said base region extending into said drift region from said first major surface, said source/emitter region extending into said base region from said first major surface, said channel portion of said base region disposed adjacent said first major surface, said insulated gate electrode disposed on said first major surface adjacent said channel portion of said base region, said collector region extending into said drift region from said first major surface, and said drain region extending from said second major surface toward said first major surface.

11. The circuit recited in claim 10 wherein said drain region spaces said drift region from said second major surface.

12. The circuit recited in claim 1 wherein said drift region includes a buffer portion disposed adjacent said second PN junction which is more heavily doped than the remainder of said drift region.

13. A semiconductor integrated circuit comprising:

a body of semiconductor material having first and second opposed major surfaces;

a drift region disposed within said semiconductor body between said first and second major surfaces, having one type conductivity and extending to said first major surface;

a base region having an opposite type conductivity extending into said drift region from said first major surface and forming a first PN junction with said drift region;

a source/emitter region having said one type conductivity disposed within said base region and forming a second PN junction therewith and extending to said first major surface;

said base region including a channel portion disposed adjacent said first major surface and extending between said source and drift regions;

an insulated gate electrode disposed on said first major surface adjacent said channel portion of said base region for controlling the conductivity of said channel portion of said base region for charge carriers of said one conductivity type;

a collector region of said opposite type conductivity forming a third PN junction with said drift region and spaced from said base region;

a drain region of said one type conductivity disposed adjacent to said drift region and more heavily doped to said one type conductivity than said drift region;

a first electrode disposed in ohmic contact with said source/emitter and base regions and comprising a first main terminal;

a collector electrode disposed in ohmic contact with said collector region;

a drain electrode disposed in ohmic contact with said drain region; and a drain/collector circuit connected to said device, said drain/collector circuit including said drain and collector regions, said drain and collector electrodes a non-zero resistive impedance and a second main terminal.

14. The integrated circuit recited in claim 13 wherein:

said collector region extends into said drift region from said first major surface; and said drain region extends from said second major surface toward said first major surface whereby said insulated gate bipolar transistor is a lateral transistor and said MOSFET is a vertical transistor.

15. The semiconductor device recited in claim 14 wherein:

said drain region spaces said drift region from said second major surface.

16. The integrated circuit recited in claim 13 wherein:

said drain region extends to said first major surface; and said collector region extends from said second major surface toward said first major surface whereby said insulated gate bipolar transistor is a vertical transistor and said MOSFET is a lateral device.

17. The integrated circuit recited in claim 16 wherein:

said collector region everywhere spaces said drift region from said second major surface.

18. The integrated circuit recited in claim 13 wherein:

said resistive impedance is disposed within said body of semiconductor material.

19. The integrated circuit recited in claim 13 wherein:

said resistive impedance is external to said device; and said second main terminal is connected through at least a portion of said resistive impedance to said drain electrode.

20. The integrated circuit recited in claim 19 wherein:

said second main terminal is connected to said collector electrode through a portion of said resistive impedance.

21. The integrated circuit recited in claim 13 wherein:

said second main terminal comprises said collector electrode.

22. The integrated circuit recited in claim 13 wherein:

said resistive impedance is external to said device; and said second main terminal is connected to said collector electrode through at least a portion of said resistive impedance.

23. The integrated circuit recited in claim 22 wherein:

said second main terminal comprises said drain electrode.

24. The integrated circuit recited in claim 13 wherein:

said drain region extends into said drift region from said first major surface; and said collector region extends into said drift region from said first major surface whereby both said insulated gate transistor and said MOSFET are lateral devices.

25. The integrated circuit recited in claim 13 wherein:

said drift region includes a more heavily doped buffer portion disposed adjacent to said collector region.

26. The circuit recited in claim 1 wherein:

said resistive impedance is at least 5 ohms.

27. The circuit recited in claim 3 wherein:

the resistance between said second main electrode and said third PN junction is minimized and said resistive impedance is at least 50 ohms.

28. The circuit recited in claim 5 wherein:

the resistance between said second main electrode and said interface between said drift and drain regions is minimized and said resistive impedance is at least 5 ohms.

29. The circuit recited in claim 7 wherein:

the resistance between said second main electrode and said interface between said drift and drain regions is minimized and said resistive impedance is at least 5 ohms.

30. The circuit recited in claim 19 wherein:

the resistance between said second main electrode and said third PN junction is minimized and said resistive impedance is at least 50 ohms.

31. The circuit recited in claim 22 wherein:

the resistance between said second main electrode and said interface between said drift and drain regions is minimized and said resistive impedance is at least 5 ohms.

* * * * *